(12) United States Patent
Choi et al.

(10) Patent No.: US 8,283,787 B2
(45) Date of Patent: Oct. 9, 2012

(54) SEMICONDUCTOR DEVICE

(75) Inventors: Won-John Choi, Gyeonggi-do (KR);
Su-Hyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 118 days.

(21) Appl. No.: 12/833,133

(22) Filed: Jul. 9, 2010

(65) Prior Publication Data

US 2011/0291290 A1  Dec. 1, 2011

(30) Foreign Application Priority Data

May 31, 2010  (KR) .......................... 10-2010-0050768

(51) Int. Cl.
*H01L 23/48* (2006.01)

(52) U.S. Cl. ........ 257/774; 257/773; 257/777; 257/686; 257/E23.011; 438/629; 438/637; 438/639

(58) Field of Classification Search .................. 257/774, 257/773, 777, 686, E23.011; 438/629, 637, 438/639

See application file for complete search history.

(56) References Cited

U.S. PATENT DOCUMENTS

| 2005/0286286 A1* | 12/2005 | Saito et al. ....................... 365/63 |
| 2009/0001543 A1* | 1/2009 | Chung .......................... 257/686 |

FOREIGN PATENT DOCUMENTS

JP  2002-261414  9/2002

OTHER PUBLICATIONS

Notice of Allowance issued by the Korean Intellectual Property Office on Jan. 6, 2012.

* cited by examiner

*Primary Examiner* — Thinh T Nguyen
(74) *Attorney, Agent, or Firm* — IP & T Group LLP

(57) ABSTRACT

A semiconductor device includes a through-silicon-via arranged to couple a plurality of stacked semiconductor chips, an interconnection line coupled to the through-silicon-via at one side and arranged to couple the through-silicon-via to the semiconductor chip, an internal interconnection line disposed at the other side of the interconnection line and intersected with the interconnection line, and at least one first contact disposed to couple the internal interconnection line to the interconnection line. A region of the interconnection line in which the internal interconnection line is disposed is equally divided, and an area between the divided regions is removed.

8 Claims, 4 Drawing Sheets

SEMICONDUCTOR DEVICE

CROSS-REFERENCE TO RELATED APPLICATIONS

The present application claims priority of Korean Patent Application No. 10-2010-0050768, filed on May 31, 2010, which is incorporated herein by reference in its entirety.

BACKGROUND OF THE INVENTION

Exemplary embodiments of the present invention relate to a semiconductor device, and more particularly, to a semiconductor device including a plurality of stacked semiconductor chips.

Packaging technology for integrated semiconductor devices has been continuously developed according to demands for the semiconductor device which is miniaturized and has a large capacity. Recently, a variety of technologies for stacked semiconductor packages capable of satisfying characteristics with respect with mounting efficiency as well as the miniaturization and large capacity have been developed.

The stacked semiconductor package may be fabricated by two methods. The first method is to stack individual semiconductor chips and package the stacked individual semiconductor chips at once. The second method is to stack individual semiconductor chips which are packaged. The individual semiconductor chips of the stacked semiconductor package are electrically coupled through metallic wires or through-silicon-vias (TSVs).

In the case of the conventional stacked semiconductor package using metallic wires, its operating speed is low because the electrical signal exchange is performed through the metallic wires, and electrical characteristics are degraded because a large number of wires are used. Furthermore, the size of the package may increase due to an additional area for forming the metallic wires in a substrate, and the height of the package may increase due to a gap for wire bonding between the semiconductor chips.

Recently, a stacked semiconductor package using a TSV has been developed. In general, the stacked semiconductor package is fabricated by the following method. First, a via hole passing through a semiconductor chip is formed in the semiconductor chip, and a through electrode called a TSV is formed by filling the via hole with a conductive material. Then, an upper semiconductor chip and a lower semiconductor chip are electrically coupled via the through electrode.

SUMMARY OF THE INVENTION

An exemplary embodiment of the present invention is directed to a semiconductor device which is capable of preventing upper and lower memory chips from being disconnected by reducing stress applied to an interconnection line coupled to a TSV in a stacked semiconductor package.

In accordance with an exemplary embodiment of the present invention, a semiconductor device includes a through-silicon-via arranged to couple a plurality of stacked semiconductor chips, an interconnection line coupled to the through-silicon-via at one side and arranged to couple the through-silicon-via to the semiconductor chip, an internal interconnection line disposed at the other side of the interconnection line and intersected with the interconnection line, and at least one first contact disposed to couple the internal interconnection line to the interconnection line, wherein a region of the interconnection line in which the internal interconnection line is disposed is equally divided, and an area between the divided regions is removed.

In accordance with another exemplary embodiment of the present invention, a semiconductor device includes a through-silicon-via arranged to couple a plurality of stacked semiconductor chips, an interconnection line coupled to the through-silicon-via and arranged to couple the through-silicon-via to the semiconductor chip, a first internal interconnection line disposed at one side of the interconnection line and intersected with the interconnection line, a second internal interconnection line disposed at the other side of the interconnection lien and intersected with the interconnection line, at least one first contact disposed to couple the first internal interconnection line to the interconnection line, and at least one second contact disposed to couple the second internal interconnection line to the interconnection line, wherein a region of the interconnection line intersected with the first and second internal interconnection lines is equally divided, and an area between the divided regions is removed.

In accordance with further exemplary embodiment of the present invention, a semiconductor device includes a through-silicon-via arranged to couple a plurality of stacked semiconductor chips and an interconnection line having equally divided regions and electrically coupling the semiconductor chip with the through-silicon-via, wherein a region between the equally divided regions is removed as a dummy region

DESCRIPTION OF SPECIFIC EMBODIMENTS

Figure 1:
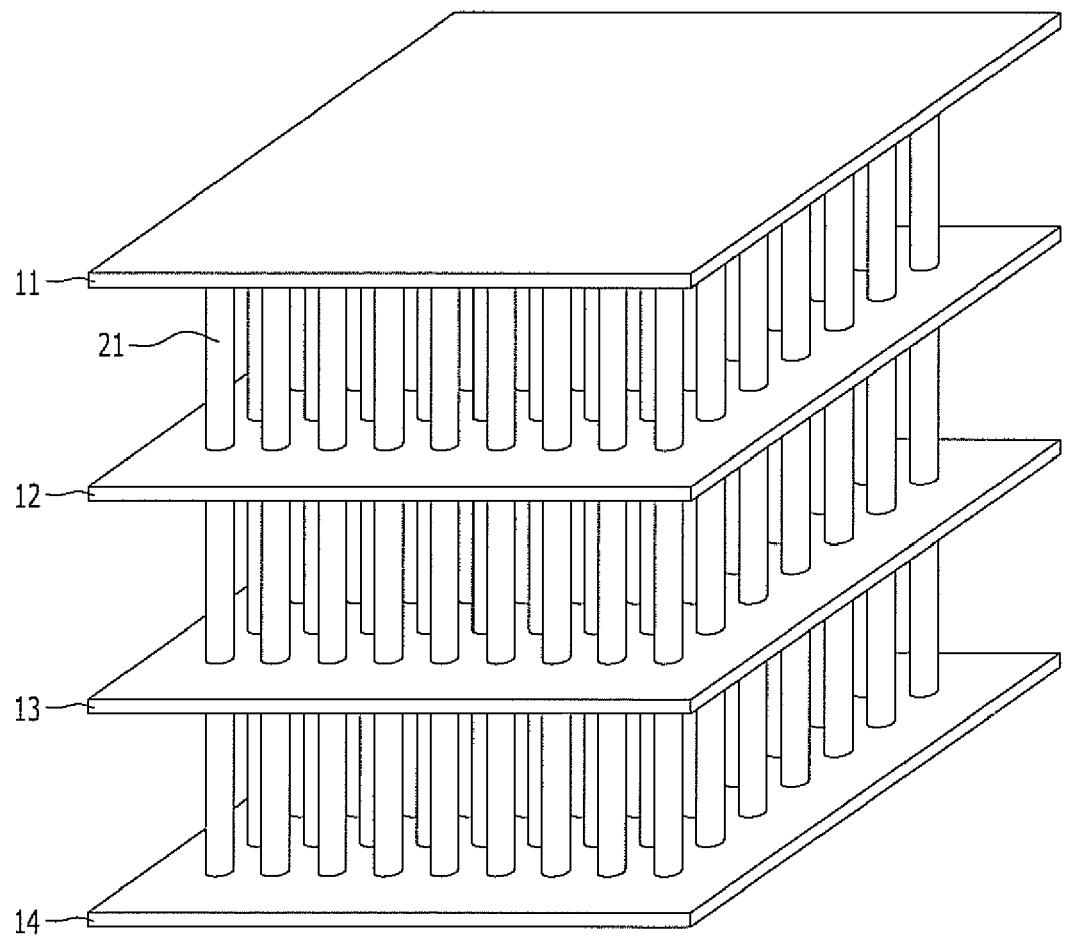
FIG. 1 illustrates a stacked semiconductor package including TSVs.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

As the capacity of memory chips embedded into a semiconductor package has recently increased, a plurality of memory chips performing at least two same or different functions are stacked in the semiconductor package.

In semiconductor devices in accordance with embodiments of the present invention, stress applied to a TSV and its signal is reduced by equally dividing an upper metal interconnection line which is coupled to the TSV and transmit the signal in one direction or multiple directions in a stacked semiconductor package, thereby preventing disconnection of upper and lower memory chips.

Figure 2:
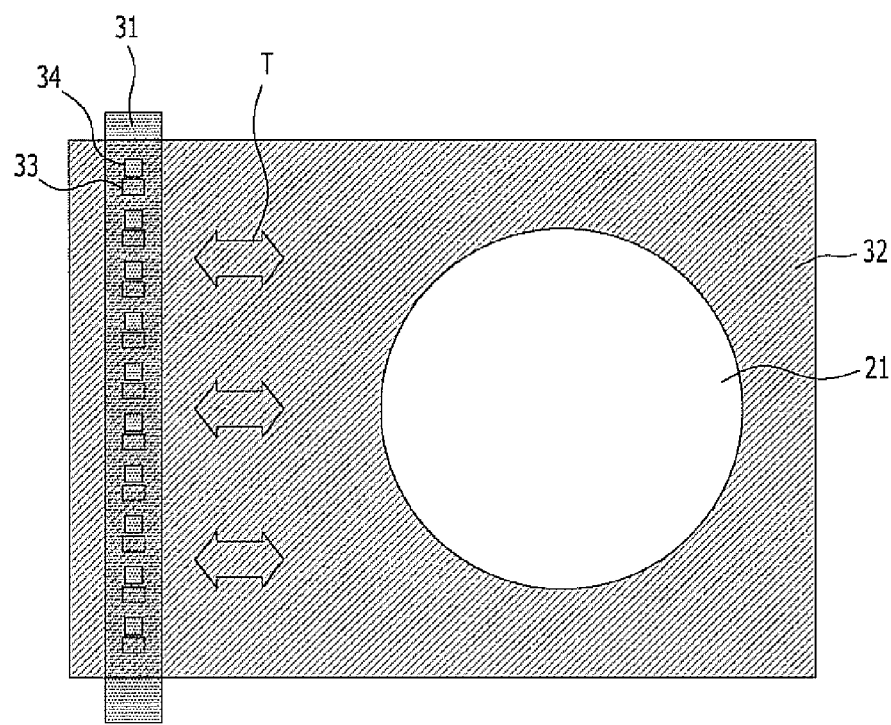
FIG. 2 illustrates an interconnection to which a TSV of FIG. 1 is coupled.

FIG. 1 illustrates a semiconductor device in which TSV are formed. FIG. 2 illustrates an interconnection line to which a TSV of FIG. 1 is coupled.

Referring to FIG. 1, a semiconductor device includes a plurality of semiconductor chips 11 to 14 which are sequentially stacked and coupled through TSVs 21. The plurality of semiconductor chips 11 to 14 may be memory chips or may be semiconductor chips having different functions. The following description is made on the assumption that the plurality of semiconductor chips 11 to 14 are memory chips.

TSVs are used to couple the plurality of memory chips, and the respective memory chips are coupled as illustrated in FIG. 2. In order for allowing signal exchange between the memory chip and the TSV, an internal interconnection line 31 and a TSV 21 are coupled as illustrated in FIG. 2. The internal interconnection line 31 is a line formed at the fabrication of the memory chip.

The TSV 21 is coupled to an interconnection line 32, and the interconnection line 32 and the internal interconnection line 31 are coupled through a first contact 33. At least two or more first contacts 33 are provided. A second contact 34 coupled to the internal interconnection line 31 is provided for coupling the internal interconnection line 31 to other portion of the memory chip.

When the interconnection line 32 is formed as illustrated in FIG. 2 to couple the internal interconnection line 31 to the TSV 21, severe stress may occur during processes (see reference symbol "T" of FIG. 2). The stress may cause a disconnect between the internal interconnection line 31 and the contacts 33 and 34. In some cases, a signal may not pass between the internal interconnection line 31 and the memory chip.

An embodiment of the present invention is directed to a semiconductor device which is capable of substantially preventing upper and lower memory chips from being disconnected by reducing stress applied to an interconnection line coupled to a TSV in a stacked semiconductor package.

Figure 3:
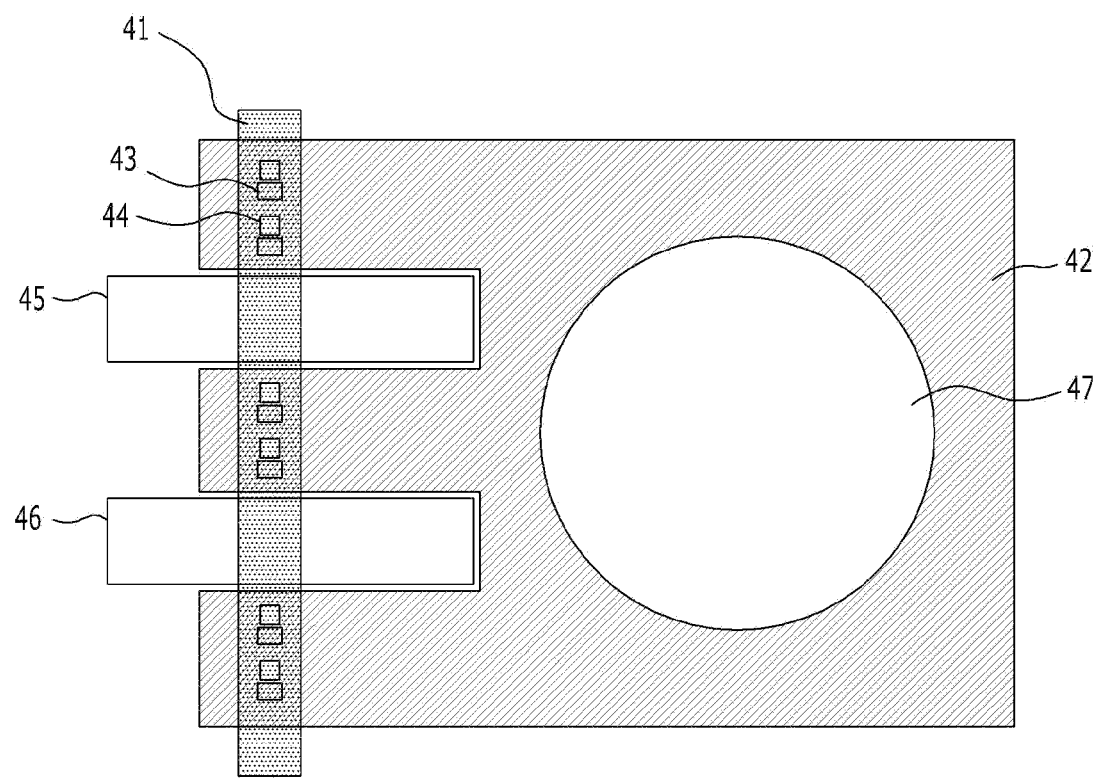
FIG. 3 illustrates an interconnection to which a TSV is coupled in accordance with an embodiment of the present invention.

FIG. 3 illustrates an interconnection line to which a TSV is coupled in accordance with an embodiment of the present invention.

Referring to FIG. 3, a semiconductor device in accordance with an embodiment of the present invention includes a plurality of stacked semiconductor chips, a TSV 47 for coupling the stacked semiconductor chips, an internal interconnection line 41, an interconnection line 42, a first contact 43, and a second contact 44. In particular, in order to reduce stress applied to the interconnection line 42, the interconnection line 42 is formed in such a manner that A and B regions 45 and 46 are removed.

That is, in order to reduce the range of stress applied to the internal interconnection line 41 and the TSV 47, the area of the interconnection line 42 is equally divided. The area of the interconnection line 42 may be divided into three equal parts, or may be divided into another number of equal parts to reduce stress. When the area of the interconnection line 42 is equally divided, other interconnection lines may be disposed between the divided areas, that is, the A and B regions 45 and 46. Also, the A and B regions 45 and 46 may be used as dummy spaces of the interconnection line in order to reduce the range of stress.

Figure 4:
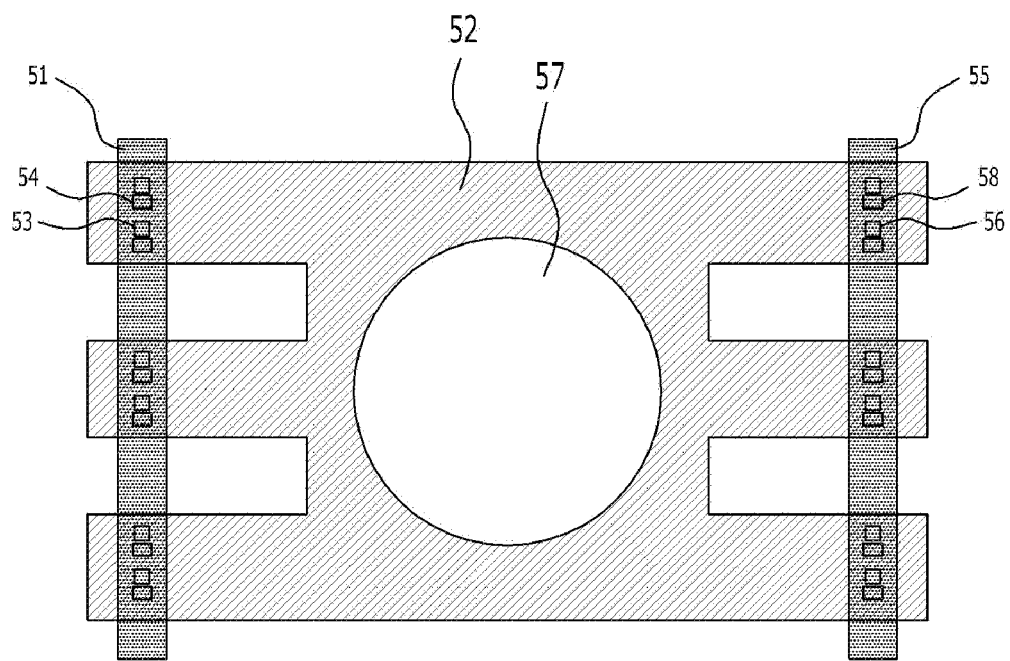
FIG. 4 illustrates an interconnection to which a TSV is coupled in accordance with another embodiment of the present invention.

FIG. 4 illustrates an interconnection line to which a TSV is coupled in accordance with another embodiment of the present invention.

Referring to FIG. 4, a semiconductor device in accordance with another embodiment of the present invention includes a plurality of stacked semiconductor chips, a TSV 57 for coupling the stacked semiconductor chips, internal interconnection lines 51 and 55, an interconnection line 52, contacts 53, 54, 56 and 58. In particular, in order to reduce stress applied to the interconnection line 52 at two opposite sides thereof where the internal interconnection lines 51 and 55 are coupled, the interconnection line 52 are formed, not in a rectangular shape, but in such a manner that the area at the opposite sides are divided into three parts as illustrated in FIG. 4 and predetermined regions are removed around the equally divided regions. In this embodiment, the internal interconnection lines 51 and 55 are disposed on two opposite sides of the interconnection line 52. The contacts 56 and 58 coupled to the internal interconnection line 55 are disposed to be symmetrical with the contacts 53 and 54 coupled to the internal interconnection line 51.

In the semiconductor device in accordance with the embodiment of the present invention, the internal interconnection lines 51 and 55 are disposed on two opposite sides of the interconnection line 52 in order to prevent the internal interconnection 51 or the contacts 53 and 54 coupled to the internal interconnection line 51 from being damaged by stress applied to the interconnection line 52 in a direction. That is, the same stress is applied to opposite sides of the interconnection line 52. Thus, even though one internal interconnection line is disconnected, a corresponding signal may be transferred through the other internal interconnection disposed at the opposite side. Consequently, signals may be stably transferred between the stacked memory chips.

As described above, the stress applied to the TSV and the internal interconnection may be reduced by equally distributing the stress applied to the interconnection line coupling the TSV to the internal interconnection line may be reduced by equally distributing the stress in one direction or multiple directions. Thus, the coupling between the stacked upper and lower memory chips may be maintained more reliably.

In the stacked semiconductor package, the upper and lower memory chips can be prevented from being disconnected by reducing the stress applied to the interconnection line coupled to the TSV.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a through-silicon-via arranged to couple a plurality of stacked semiconductor chips;
   an interconnection line coupled to the through-silicon-via and arranged to couple the through-silicon-via to a respective one of the semiconductor chips;
   an internal interconnection line disposed at a side of the interconnection line and intersected with the interconnection line; and
   at least one first contact disposed to couple the internal interconnection line to the interconnection line,
   wherein a region of the interconnection line in which the internal interconnection line is disposed is equally divided, and an area between the divided regions is removed.

2. The semiconductor device of claim 1, further comprising a second contact disposed to couple the internal interconnection line to the respective semiconductor chip.

3. A semiconductor device comprising:
   a through-silicon-via arranged to couple a plurality of stacked semiconductor chips;

an interconnection line coupled to the through-silicon-via and arranged to couple the through-silicon-via to a respective one of the semiconductor chips;

a first internal interconnection line disposed at one side of the interconnection line and intersected with the interconnection line;

a second internal interconnection line disposed at the other side of the interconnection line and intersected with the interconnection line;

at least one first contact disposed to couple the first internal interconnection line to the interconnection line; and at least one second contact disposed to couple the second internal interconnection line to the interconnection line, wherein a region of the interconnection line intersected with the first and second internal interconnection lines is equally divided, and an area between the divided regions is removed.

4. The semiconductor device of claim 3, wherein the first and second internal interconnection lines are symmetrically disposed and the first contact and the second contact are symmetrically disposed with respect to the through-silicon-via.

5. A semiconductor device comprising:

a through-silicon-via arranged to couple a plurality of stacked semiconductor chips; and an interconnection line having equally divided regions and electrically coupling a respective one of the semiconductor chips with the through-silicon-via, wherein a region between the equally divided regions is removed as a dummy region.

6. The semiconductor device of claim 5, further comprising:

an internal interconnection line disposed on the equally divided regions of the interconnection line; and at least one first contact disposed to couple the internal interconnection line to the interconnection line.

7. The semiconductor device of claim 6, wherein the internal interconnection line includes:

a first internal interconnection line disposed at one side of the interconnection line and intersected with the interconnection line; and a second internal interconnection line disposed at the other side of the interconnection line and intersected with the interconnection line.

8. The semiconductor device of claim 6, further comprising:

a second contact disposed to couple the internal interconnection line to the respective semiconductor chip.

* * * * *